(12) United States Patent
Kim et al.

(10) Patent No.: US 9,422,638 B2
(45) Date of Patent: Aug. 23, 2016

(54) SILICON SUBSTRATE INCLUDING AN EDGE PORTION, EPITAXIAL STRUCTURE INCLUDING THE SAME, AND METHOD OF MANUFACTURING THE SILICON SUBSTRATE

(75) Inventors: Jun-youn Kim, Suwon-si (KR); Jae-Kyun Kim, Hwaseong-si (KR); Su-hee Chae, Suwon-si (KR); Hyun-gi Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 640 days.

(21) Appl. No.: 13/614,315

(22) Filed: Sep. 13, 2012

(65) Prior Publication Data

US 2013/0140567 A1 Jun. 6, 2013

(30) Foreign Application Priority Data

Dec. 5, 2011 (KR) .................. 10-2011-0129159

(51) Int. Cl.
*C30B 25/18* (2006.01)
*H01L 21/02* (2006.01)
(Continued)

(52) U.S. Cl.
CPC .............. *C30B 25/186* (2013.01); *C30B 29/06* (2013.01); *C30B 29/403* (2013.01); *H01L 21/0243* (2013.01); *H01L 21/0254* (2013.01);
(Continued)

(58) Field of Classification Search
CPC ...... C30B 23/00; C30B 23/02; C30B 23/025; C30B 29/02; C30B 29/06; C30B 33/00; C30B 33/08; C30B 33/10; C23B 25/00; C23B 25/02; C23B 25/04; C23B 25/18; C23B 25/186; C23C 22/00; C23C 22/05; C23C 22/78; C23C 16/00; C23C 16/02; C23C 16/0227; C23C 16/0236; C23C 16/0245; C23C 26/0254; C23C 26/0263; C23C 16/04; C23C 16/042; C23C 14/00; C23C 14/02; C23C 14/04; C23C 14/042
USPC .............. 117/84, 88, 92, 94–95, 97, 101, 106
See application file for complete search history.

(56) References Cited

U.S. PATENT DOCUMENTS 6,059,879 A 5/2000 Gonzalez
6,110,277 A 8/2000 Braun
(Continued)

FOREIGN PATENT DOCUMENTS

CN 100356517 C 12/2007
JP 04-073930 * 3/1992
(Continued)

OTHER PUBLICATIONS

European Search Report dated Mar. 27, 2013, issued in European Application No. 12184304.9.
(Continued)

*Primary Examiner* — Kenneth A Bratland, Jr.
(74) *Attorney, Agent, or Firm* — Harness, Dickey & Pierce, P.L.C.

(57) ABSTRACT

Crack formation and propagation in a silicon substrate may be reduced by forming a crack reducing portion. The silicon substrate includes a silicon main portion and a silicon edge portion formed around the silicon main portion. The crack reducing portion is formed on the silicon edge portion of the silicon substrate such that the directions of crystal faces in the crack reducing portion are randomly oriented.

21 Claims, 5 Drawing Sheets

(51) Int. Cl.
*C30B 29/06* (2006.01)
*C30B 29/40* (2006.01)

(52) U.S. Cl.
CPC .... *H01L21/02381* (2013.01); *H01L 21/02639* (2013.01); *H01L 21/02658* (2013.01)

(56) References Cited

U.S. PATENT DOCUMENTS

| | | | |
|---|---|---|---|
| 6,315,826 B1 * | 11/2001 | Muramatsu | H01L 21/302 117/2 |
| 7,256,105 B2 | 8/2007 | Yamaguchi | |
| 2002/0197841 A1 | 12/2002 | Nagai et al. | |
| 2010/0258814 A1 | 10/2010 | Hoshi et al. | |

FOREIGN PATENT DOCUMENTS

| | | |
|---|---|---|
| JP | 4-73930 A | 3/1992 |
| JP | 2009/256154 A | 11/2009 |
| KR | 10-2003-0072528 A | 9/2003 |
| KR | 10-2004-0031284 A | 4/2004 |
| KR | 10-2010-0032513 A | 3/2010 |

OTHER PUBLICATIONS

European Office Action dated Aug. 17, 2015 issued in corresponding European Patent Application No. 12184304.9.

* cited by examiner

SILICON SUBSTRATE INCLUDING AN EDGE PORTION, EPITAXIAL STRUCTURE INCLUDING THE SAME, AND METHOD OF MANUFACTURING THE SILICON SUBSTRATE

CROSS-REFERENCE TO RELATED APPLICATION

This application claims priority under 35 U.S.C. §119 to Korean Patent Application No. 10-2011-0129159, filed on Dec. 5, 2011, in the Korean Intellectual Property Office, the disclosure of which is incorporated herein in its entirety by reference.

BACKGROUND

1. Field

Example embodiments relate to silicon substrates, epitaxial structures including the same, and methods of manufacturing the silicon substrates.

2. Description of the Related Art

Many nitride-based semiconductor devices use a sapphire substrate. However, a sapphire substrate is expensive, is difficult for manufacturing chips, and has relatively low electric conductivity. Furthermore, manufacturing a sapphire substrate having a relatively large diameter may be difficult because the sapphire substrate warps at higher temperatures during epitaxial growth due to its relatively low thermal conductivity. In order to prevent or inhibit the above problems, nitride-based semiconductor devices using a silicon (Si) substrate instead of a sapphire substrate have been developed.

Because a silicon substrate has higher thermal conductivity than a sapphire substrate, the silicon substrate does not warp greatly at higher temperatures for growing a nitride thin film, thereby making it possible to grow a thin film having a relatively large diameter on the silicon substrate. However, when a nitride thin film is grown on a silicon substrate, a dislocation density may be increased due to a mismatch in lattice constants between the silicon substrate and the nitride thin film. Consequently, a stress may be generated due to a mismatch in thermal expansion coefficients between the silicon substrate and the nitride thin film.

Also, when a nitride semiconductor is grown on a silicon substrate having a relatively large diameter, a stress may be generated on the silicon substrate at higher temperatures while the nitride semiconductor thin film is being grown. Because the silicon substrate is ductile at higher temperatures, the generated stress may cause plastic deformation of the silicon substrate. As a result, the silicon substrate may become more brittle, and thus cracks may be generated and propagated relatively easily at edge portions of the silicon substrate during a growing process of the nitride semiconductor or a cooling process to room temperature. In some cases, the silicon substrate may fracture due to the cracks and the thermal shock may occur during a fabrication process.

SUMMARY

Example embodiments provide silicon substrates, epitaxial structures including the same, and methods of manufacturing the silicon substrates that may reduce cracks.

Additional aspects will be set forth in part in the description which follows and, in part, will be apparent from the description, or may be learned by practice of example embodiments.

According to example embodiments, a silicon substrate may include a silicon edge portion around a silicon main portion, and a crack reducing portion on the silicon edge portion such that directions of crystal faces of the crack reducing portion are random.

The crack reducing portion may include an embossed portion on a top surface of the silicon edge portion. The crack reducing portion may include a dielectric film on a top surface of the silicon edge portion. The dielectric film may be on a side portion of the silicon edge portion. The dielectric film may be one of a nitride film and an oxide film. The crack reducing portion may be formed by implanting ions into the top surface of the silicon edge portion.

According to example embodiments, an epitaxial structure may include a silicon substrate including a silicon edge portion around a silicon main portion, and a crack reducing portion on the silicon edge portion such that directions of crystal faces of the crack reducing portion are random, at least one first nitride semiconductor thin film on the silicon main portion of the silicon substrate, and a second nitride semiconductor thin film on the crack reducing portion of the silicon substrate.

The second nitride semiconductor thin film may have one of a polycrystalline structure and an amorphous structure. The crack reducing portion may include an embossed portion on a top surface of the silicon edge portion. The crack reducing portion may include a dielectric film on a top surface of the silicon edge portion.

The dielectric film may be on a side surface of the silicon edge portion. The dielectric film may be one of a nitride film and an oxide film. The crack reducing portion may be formed by implanting ions into a top surface of the silicon edge portion. The at least one first nitride semiconductor thin film may be formed of $Al_xIn_yGa_{1-x-y}N$ ($0 \le x$, $y \le 1$, $x \ne y$).

According to example embodiments, a method of manufacturing a silicon substrate may include preparing a parent silicon substrate, and forming a crack reducing portion on an edge portion of the parent silicon substrate such that directions of crystal faces of the crack reducing portion are random.

An uneven portion may be formed on a top surface of the edge portion of the parent silicon substrate by a patterning process, and etching the uneven portion. A dielectric film may be formed on the parent silicon substrate by a patterning process, and removing a portion of the dielectric film other than the dielectric film formed on the edge portion by a lift-off process.

A dielectric film may be deposited on the edge portion of the parent silicon substrate. One of a nitride film and an oxide film may be deposited on the edge portion. Ions may be implanted into a top surface of the edge portion of the parent silicon substrate.

According to example embodiments, a method of manufacturing an epitaxial structure may include forming an edge portion around a main portion of a silicon substrate, forming a crack reducing portion on the edge portion of a silicon substrate such that directions of crystal faces of the crack reducing portion are random, growing at least one first nitride semiconductor thin film on the main portion of the silicon substrate, and forming a second nitride semiconductor thin film on the crack reducing portion of the silicon substrate.

A dielectric film may be deposited on the edge portion. One of a nitride film and an oxide film may be deposited on the edge portion. Ions may be implanted into a top surface of the edge portion. An embossed portion may be formed on a top surface of the edge portion.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
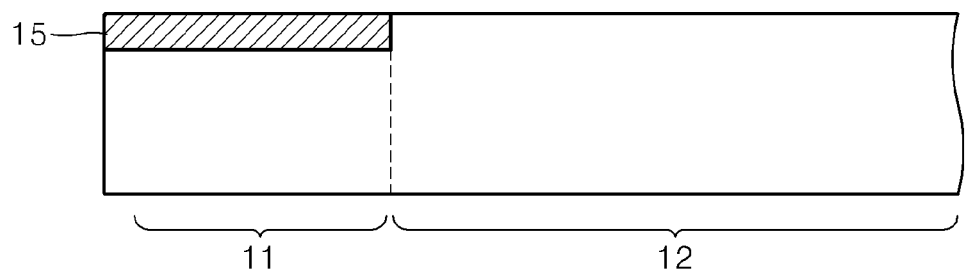
FIG. 1 is a cross-sectional view illustrating a silicon substrate according to example embodiments.

The inventive concepts will now be described more fully with reference to the accompanying drawings, in which example embodiments are shown. In the drawings, the same reference numerals denote the same elements and the thicknesses of layers and regions and the sizes of components may be exaggerated for clarity. The inventive concepts may have different forms and should not be construed as limited to the example embodiments set forth herein. For example, it will also be understood that when a layer is referred to as being "on" another layer or a substrate, it can be directly on the other layer or the substrate, or intervening layers may also be present therebetween.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a silicon substrate 10 according to example embodiments. The silicon substrate 10 includes a silicon main portion 12, and a silicon edge portion 11 formed around the silicon main portion 12. The silicon substrate 10 may have a circular shape. The silicon main portion 12 may be an inner portion surrounded by an edge of the silicon substrate 10. Also, the silicon main portion 12 may be a portion where a single-crystal nitride semiconductor thin film is to be grown. The silicon substrate 10 may include a crack preventing or reducing portion 15, for example, having crystal faces in random directions and formed on a top surface of the silicon edge portion 11.

The silicon main portion 12 may have, for example, a Si(111) crystal face, and the crack preventing or reducing portion 15 may have an irregular crystal face. Because of the irregular crystal face of the crack preventing or reducing portion 15, a nitride semiconductor thin film on the crack preventing or reducing portion 15 may be grown into an amorphous or polycrystalline state. A nitride semiconductor thin film on the silicon main portion 12 may be grown into a single-crystal state.

If the crack preventing or reducing portion 15 of the silicon substrate 10 has a crystal face having random growth directions or a rough surface, a nitride semiconductor thin film grown on the silicon substrate 10 may have a part grown on the silicon main portion 12 with crystals oriented, for example, into a (111) direction and a part grown on the crack preventing or reducing portion 15 with randomly oriented crystals due to the rough surface of the crack preventing or reducing portion 15. Accordingly, the part of the nitride semiconductor thin film grown on the crack preventing or reducing portion 15 may have a polycrystalline or amorphous state which is different from the state of the part grown on the silicon main portion 15. Because the nitride semiconductor thin film includes heterogeneous crystal characteristics, a stress at an interface between the nitride semiconductor thin film and the silicon substrate 10 may be reduced. Thus, a relatively low stress may be achieved which may be lower than that in a nitride semiconductor thin film grown homogenously into a single-crystal state on the Si(111) crystal face of the silicon substrate 10 without the crack preventing or reducing portion 15. Accordingly, when a nitride semiconductor thin film is grown on the silicon substrate 10 with the silicon edge portion 15, the interface stress between the nitride semiconductor thin film and the substrate 10 may be lowered, and thus the deformation of the silicon substrate 10 may be reduced.

Figure 2:
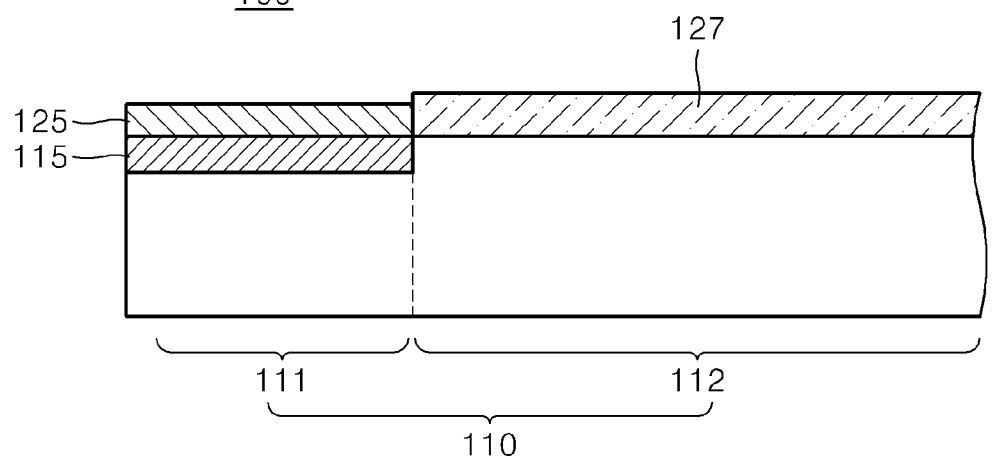
FIG. 2 is a cross-sectional view illustrating an epitaxial structure according to example embodiments.

FIG. 2 is a cross-sectional view illustrating an epitaxial structure 100 according to example embodiments. The epitaxial structure 100 may include a silicon substrate 110, and a nitride semiconductor thin film formed on the silicon substrate 110. The silicon substrate 110 may include a silicon main portion 112, and a silicon edge portion 111 formed around the silicon main portion 112. The silicon substrate 110 having a relatively large diameter equal to or greater than, for example, about 8 inches. The silicon substrate 110 may be formed by doping, for example, p-type or n-type impurities. The p-type impurities may include at least one selected from boron (B), aluminum (Al), magnesium (Mg), calcium (Ca), zinc (Zn), cadmium (Cd), mercury (Hg), and gallium (Ga), and the n-type impurities may include at least one of arsenic (As) and phosphorus (P). If the silicon substrate 110 is formed by heavily doping p-type impurities, the warping of the silicon substrate 110 may be reduced.

A crack preventing or reducing portion 115 of which growth directions of crystals are random may be formed on a top surface of the silicon edge portion 111. A parent substrate refers to a substrate before the crack preventing or reducing portion 115 is formed. The silicon substrate 110 may be formed by forming the crack preventing or reducing portion 115 on an edge portion of the parent substrate. The nitride semiconductor thin film may include a first nitride semiconductor thin film 127 grown on the silicon main portion 112 and a second nitride semiconductor thin film 125 grown on the crack preventing or reducing portion 115.

The silicon main portion 112 may have, for example, a Si(111) crystal face, and the first nitride semiconductor thin film 127 may be grown into a single-crystal state. The first nitride semiconductor thin film 127 may have a single-layer structure or a multi-layer structure, and may be formed of, for example, $Al_xIn_yGa1-x-yN$ ($0 \leq x$, $y \leq 1$, $x \neq y$). For example, the at least one layer of the first nitride semiconductor thin film 127 may be formed of a nitride including gallium. Alternatively, at least one layer of the first nitride semiconductor thin film 127 may be formed of a material including any one of GaN, InGaN, and AlInGaN. The silicon substrate 110 may be doped or undoped.

At least one layer of the first nitride semiconductor thin film 127 may be selectively undoped or doped. For example, a nitride semiconductor thin film which is an uppermost layer of the first nitride semiconductor thin film 127 may be doped with n-type or p-type impurities and remaining nitride semiconductor thin films may be undoped.

The first nitride semiconductor thin film 127 which is grown on the silicon main portion 112 having, for example, the Si(111) crystal face, may be a single-crystal thin film. The second nitride semiconductor thin film 125 which is grown on the crack preventing or reducing portion 115 of which growth directions of crystals are random may be a polycrystalline or amorphous thin film. Due to a stress generated at an interface between the silicon substrate 110 and the nitride semiconductor thin film, the silicon substrate 110 may be cracked when the nitride semiconductor thin film is grown or is cooled down. More cracks may be generated at an edge portion than an inner central portion of the silicon substrate 110, and the cracks may be formed along a radial direction from the edge portion toward the central portion. A stress applied to the silicon substrate 110 may be higher with a single crystal nitride semiconductor thin film than with a polycrystalline or amorphous nitride semiconductor thin film. Accordingly, a smaller stress may be applied between the crack preventing or reducing portion 125 and the second nitride semiconductor thin film 125. Hence, stress induced deformation or crack generation in the silicon edge portion 111 of the silicon substrate 110 may be reduced. Various examples of the crack preventing or reducing portion 125 will be explained below.

Figure 3:
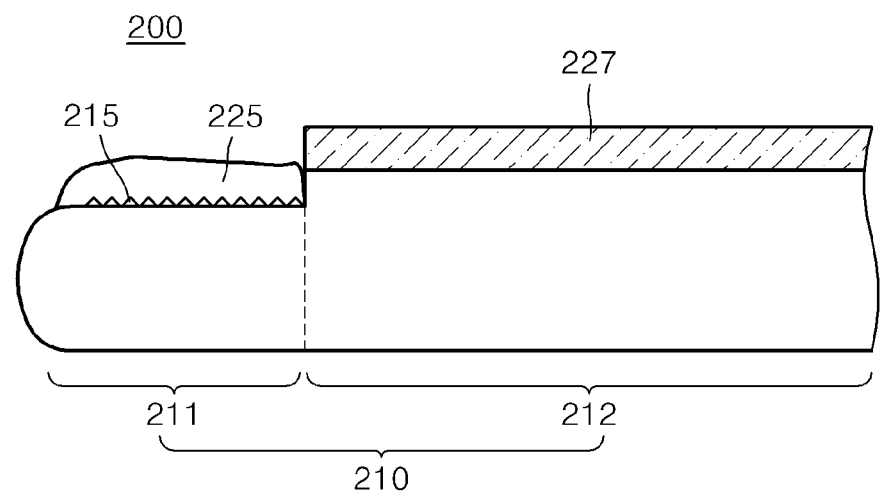
FIG. 3 is a cross-sectional view illustrating an epitaxial structure according to example embodiments.

FIG. 3 is a cross-sectional view illustrating an epitaxial structure 200 according to example embodiments. The epitaxial structure 200 may include a silicon substrate 210, and at least one nitride semiconductor thin film grown on the silicon substrate 210. The silicon substrate 210 may include a silicon main portion 212, a silicon edge portion 211 formed around the silicon main portion 212, and a crack preventing or reducing portion 215 formed on the silicon edge portion 211. The crack preventing or reducing portion 215 may be formed by patterning the silicon edge portion 211 and the silicon main portion 212, and performing dry etching or wet etching according to patterns. The crack preventing or reducing portion 215 may include an embossed pattern as shown in FIG. 3.

For example, a photoresist layer (not shown) may be coated on the silicon substrate 210, and a pattern may be formed on the photoresist layer by using a mask. The silicon main portion 212 may be entirely masked, and the silicon edge portion 211 may be patterned by using a mask having an embossed pattern. Exposure and etching may be performed to form the crack preventing or reducing portion 215 having an embossed pattern on the silicon edge portion 211. The photoresist layer may be removed after the crack preventing or reducing portion 215 is formed. Due to the embossed pattern, the crack preventing or reducing portion 215 may have a rough surface or a surface having random growth directions. Alternatively, growth directions of crystals of the crack preventing or reducing portion 215 having an uneven pattern or formed of a dielectric material may be irregular.

Because the silicon main portion 212 has the Si(111) crystal face, a first nitride semiconductor thin film 227 grown on the silicon main portion 212 may have a single-crystal structure. Because crystal faces of the crack preventing or reducing portion 215 are random, a second nitride semiconductor thin film 225 grown on the crack preventing or reducing portion 215 may have a polycrystalline or amorphous structure. Accordingly, because a stress applied between the crack preventing or reducing portion 215 and the second nitride semiconductor thin film 225 is reduced as described above, cracks occurring in the silicon edge portion 211 may be reduced.

Figure 4:
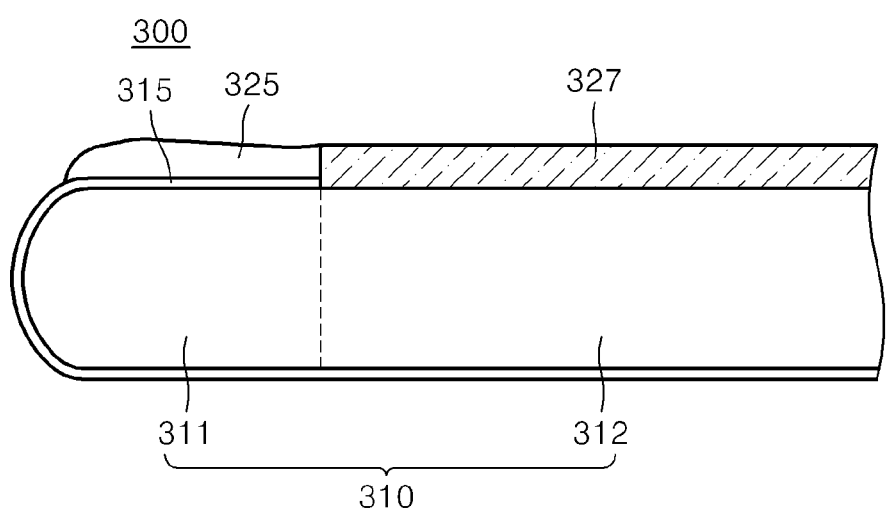
FIG. 4 is a cross-sectional view illustrating an epitaxial structure according to example embodiments.

FIG. 4 is a cross-sectional view illustrating an epitaxial structure 300 according to example embodiments. Referring to FIG. 4, the epitaxial structure 300 may include a silicon substrate 310, and at least one nitride semiconductor thin film grown on the silicon substrate 310. The silicon substrate 310 may include a silicon main portion 312, a silicon edge portion 311 formed around the silicon main portion 312, and a crack preventing or reducing portion 315 formed on the silicon edge portion 311. The crack preventing or reducing portion 315 may be formed of a thermal oxide on the silicon edge portion 311 by using, for example, thermal oxidation. Alternatively, the crack preventing or reducing portion 315 with a dielectric material may be formed by depositing the dielectric material, for example, oxide or nitride material, with a chemical vapor deposition (CVD) or a sputtering process, and by performing patterning and etching processes to have the dielectric material only on the silicon edge portion 311 through photolithography.

Alternatively, the crack preventing or reducing portion 315 with a dielectric material may be formed by patterning the dielectric material only on the silicon edge portion 311 through photolithography and then removing the dielectric material on portions other than the silicon edge portion 311 by using a lift-off process. The crack preventing or reducing portion 315 formed on the silicon edge portion 311 may extend to a side surface of the silicon substrate 310 beyond the silicon edge portion 311. A first nitride semiconductor thin film 327 having a single-crystal structure may be formed on the silicon main portion 312, and a second nitride semiconductor thin film 325 having a polycrystalline or amorphous structure may be formed on the crack preventing or reducing portion 315. Because the second nitride semiconductor thin film 325 has the polycrystalline or amorphous structure, a number of cracks occurring in the silicon edge portion 311 may be reduced.

Figure 5:
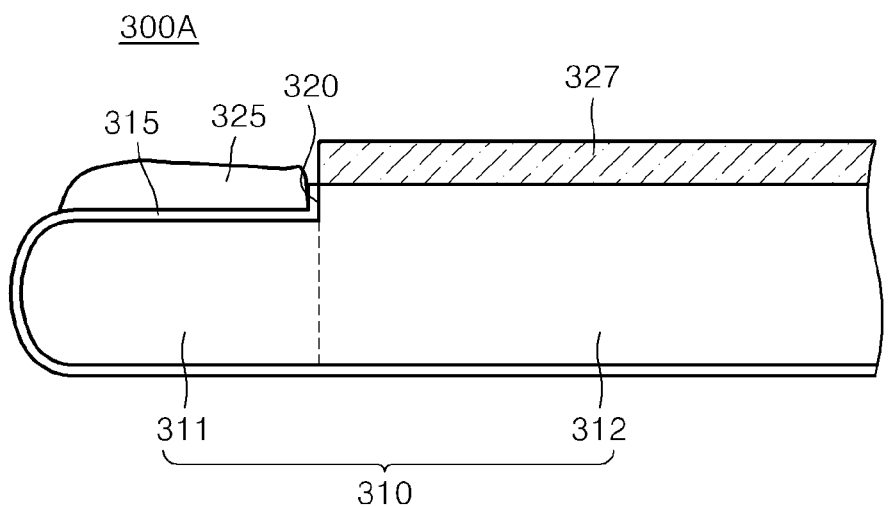
FIG. 5 is a cross-sectional view illustrating an epitaxial structure according to example embodiments.

FIG. 5 is a cross-sectional view illustrating an epitaxial structure 300A according to example embodiments. Referring to FIG. 5, a stepped portion 320 may be formed by etching an upper portion of the silicon edge portion 311 of the silicon substrate 310 of FIG. 4. The crack preventing or reducing portion 315 may be formed on the silicon edge portion 311 that is lower in height than the silicon main portion 312 of the silicon substrate 310. When the stepped portion 320 is formed between the silicon edge portion 311 and the silicon main portion 312 for the crack preventing or reducing portion 315 as shown in FIG. 5, the stepped portion 320 may be utilized for subsequent processes, for example, for a mask aligning process.

Figure 6:
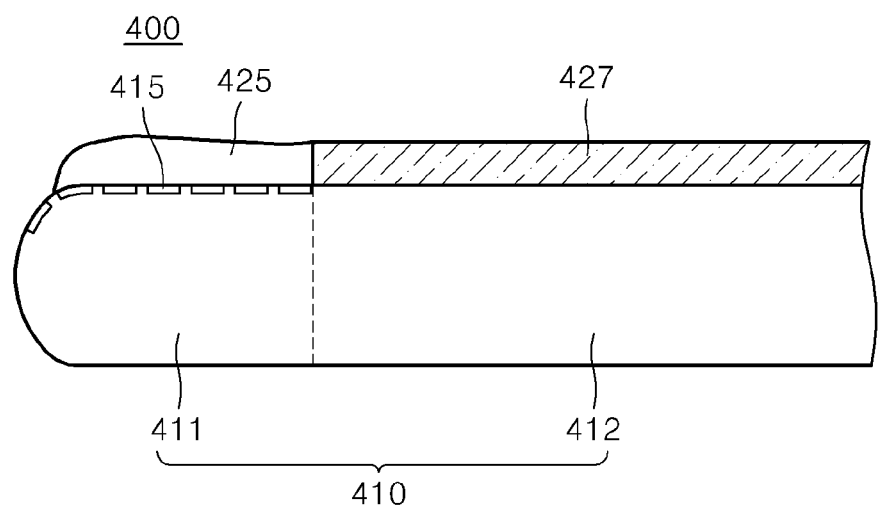
FIG. 6 is a cross-sectional view illustrating an epitaxial structure according to example embodiments.

FIG. 6 is a cross-sectional view illustrating an epitaxial structure 400 according to example embodiments. Referring to FIG. 6, the epitaxial structure 400 may include a silicon substrate 410, and at least one nitride semiconductor thin film grown on the silicon substrate 410. The silicon substrate 410 may include a silicon main portion 412, a silicon edge portion 411 formed around the silicon main portion 412, and a crack preventing or reducing portion 415 formed on the silicon edge portion 411. The crack preventing or reducing portion 415 may be formed on the silicon edge portion 411 by implanting ions. A surface of the silicon edge portion 411 may be changed to a polycrystalline or amorphous state due to the ion implantation. When a nitride semiconductor thin film is grown on the changed crack preventing or reducing portion 415, the nitride semiconductor thin film may also be grown into a polycrystalline or amorphous state. Accordingly, a first nitride semiconductor thin film 427 having a single-crystal structure may be formed on the silicon main portion 412, and a second nitride semiconductor thin film 425 having a polycrystalline or amorphous structure may be formed on the crack preventing or reducing portion 415. Although ions are implanted into only a top surface of the silicon edge portion 411 in FIG. 6, example embodiments are not limited thereto and ions may be implanted into a side surface and a bottom surface of the silicon edge portion 411 as well as the top surface, and also to a bottom surface of the silicon main portion 412. For example, the crack preventing or reducing portion 415 may extend to the side surface of the silicon edge portion 411. In example embodiments, when the silicon substrate 410 is rotated at higher speeds on a deposition device, impacts due to the higher speed rotation may be reduced, thereby further preventing or reducing cracks.

Figure 7:
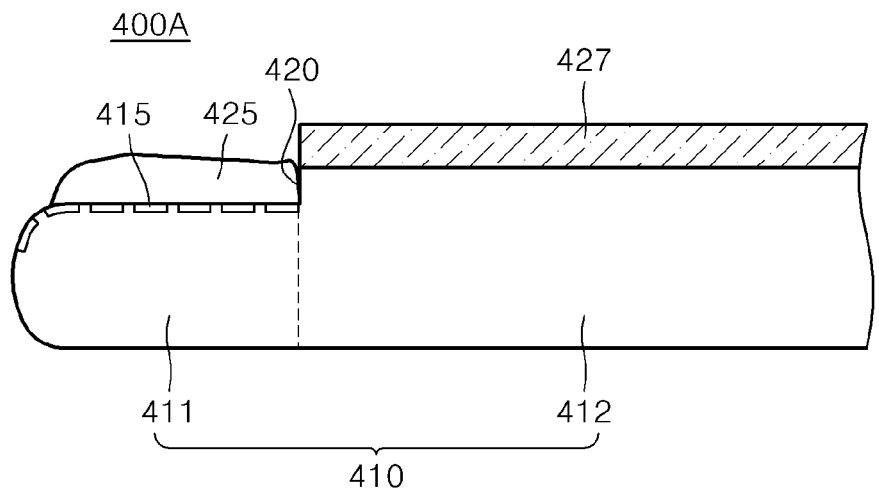
FIG. 7 is a cross-sectional view illustrating an epitaxial structure according to example embodiments.

FIG. 7 is a cross-sectional view illustrating an epitaxial structure 400A according to example embodiments. Referring to FIG. 7, a stepped portion 420 may be formed by etching an upper portion of the silicon edge portion 411 of the silicon substrate 410 of the epitaxial structure 400 of FIG. 6. The crack preventing or reducing portion 415 may be formed on the silicon edge portion 411 that is lower in height than the silicon main portion 412 of the silicon substrate 410.

Figure 8:
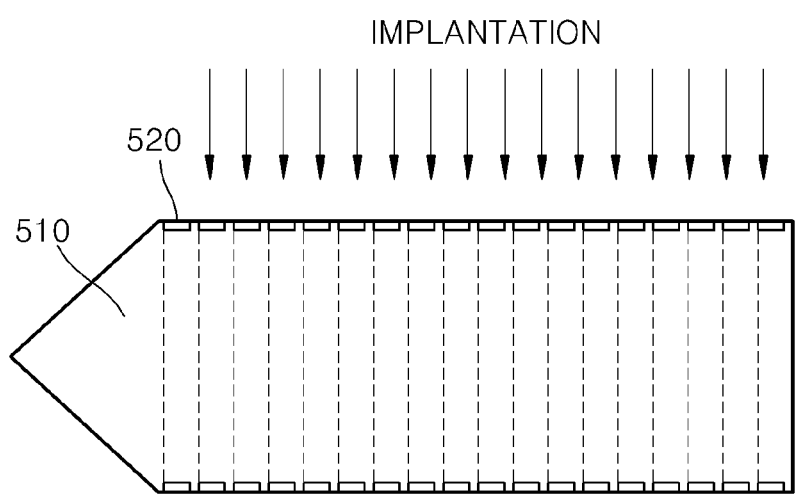
FIG. 8 is a view for explaining a method of manufacturing a silicon substrate, according to example embodiments.

FIG. 8 is a view for explaining a method of manufacturing a silicon substrate by implanting ions, according to example embodiments. Ions are implanted into an outer surface of a silicon ingot 510. Due to the ion implantation, the silicon ingot 510 has a rough surface 520. A silicon substrate (wafer) may be formed by cutting the silicon ingot 510. The rough surface 520 formed due to the ion implantation may be exposed on an edge portion of the silicon substrate and may act as a crack preventing or reducing portion. A size of the crack preventing or reducing portion formed on the edge portion of the silicon substrate may be adjusted by adjusting a depth of the rough surface 520 by adjusting a depth of the ion implantation. The silicon substrate may be more simply manufactured at lower costs by forming the crack preventing or reducing portion in the silicon ingot 510 in the aforesaid manner.

Figure 9:
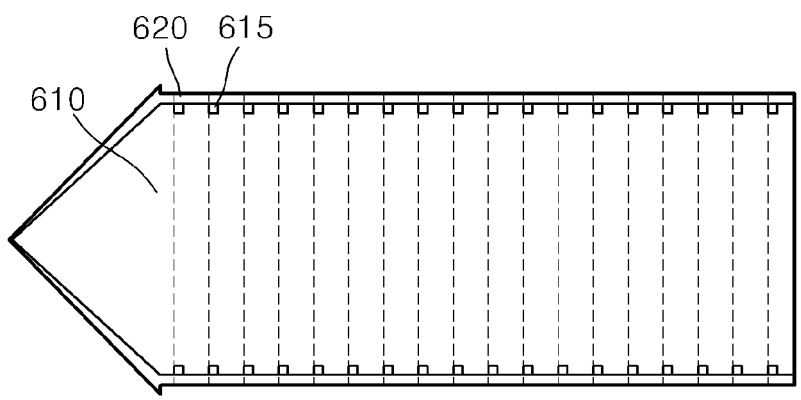
FIG. 9 is a view for explaining a method of manufacturing a silicon substrate, according to example embodiments.

FIG. 9 is a view for explaining a method of manufacturing a silicon substrate, according to example embodiments. Grooves 615 are formed in a silicon ingot 610. The grooves 615 may be formed by using, for example, laser cutting. An oxide film 620 may be formed on a surface of the silicon ingot 610 by using thermal oxidation. An oxide film may also be formed in the grooves 615 by using thermal oxidation. A silicon substrate (wafer) may be formed by cutting the silicon ingot 610. The silicon ingot 610 may be cut to expose the grooves 615. The oxide film 620 may be formed on an edge portion of the silicon substrate formed by cutting the silicon ingot 610. An oxide film may also be formed on a side portion of the silicon substrate. The silicon substrate may be more simply manufactured at lower costs by performing oxidation in the silicon ingot 610 in the aforesaid manner.

According to example embodiments, because a stress applied to an edge portion of a silicon substrate when a nitride semiconductor thin film is grown on the silicon substrate is reduced, cracks occurring in the silicon substrate may be reduced. If the diameter of a silicon substrate is larger, the silicon substrate may have more cracks. Because cracks occurring in the edge portion of the silicon substrate are reduced, a diameter of the silicon substrate may be increased. Also, a nitride semiconductor thin film having a desired thickness may be grown on the silicon substrate having a relatively large diameter equal to or greater than, for example, 6 inches. The epitaxial structure may be applied to a light-emitting diode, a Schottky diode, a laser diode, a field effect transistor, or a power device.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A silicon substrate comprising:
   a silicon edge portion around a silicon main portion, the silicon main portion having a first flat top surface and the silicon edge portion having a second flat top surface, the second flat top surface being separate from the first flat top surface; and
   a crack reducing portion on the second flat top surface of the silicon edge portion such that directions of crystal faces of the crack reducing portion are different,
   wherein an interface between the silicon edge portion and the crack reducing portion is flat.

2. The silicon substrate of claim 1, wherein the crack reducing portion includes a dielectric film on the second flat top surface of the silicon edge portion.

3. The silicon substrate of claim 2, wherein the dielectric film is on a side portion of the silicon edge portion.

4. The silicon substrate of claim 2, wherein the dielectric film is one of a nitride film and an oxide film.

5. The silicon substrate of claim 1, wherein the crack reducing portion is formed by implanting ions into the second flat top surface of the silicon edge portion.

6. An epitaxial structure comprising:
   a silicon substrate including,
      a silicon edge portion around a silicon main portion, the silicon main portion having a first flat top surface and the silicon edge portion having a second flat top surface, the second flat top surface being separate from the first flat top surface, and
      a crack reducing portion on the second flat top surface of the silicon edge portion such that directions of crystal faces of the crack reducing portion are different;
   at least one first nitride semiconductor thin film on the silicon main portion of the silicon substrate; and
   a second nitride semiconductor thin film on the crack reducing portion of the silicon substrate,
   wherein an interface between the silicon edge portion and the crack reducing portion is flat.

7. The epitaxial structure of claim 6, wherein the second nitride semiconductor thin film has one of a polycrystalline structure and an amorphous structure.

8. The epitaxial structure of claim 6, wherein the crack reducing portion includes a dielectric film on the second flat top surface of the silicon edge portion.

9. The epitaxial structure of claim 8, wherein the dielectric film is on a side surface of the silicon edge portion.

10. The epitaxial structure of claim 8, wherein the dielectric film is one of a nitride film and an oxide film.

11. The epitaxial structure of claim 6, wherein the crack reducing portion is formed by implanting ions into the second flat top surface of the silicon edge portion.

12. The epitaxial structure of claim 6, wherein the at least one first nitride semiconductor thin film is formed of $Al_xIn_yGa_{1-x-y}N$ ($0 \leq x, y \leq 1, x \neq y$).

13. A method of manufacturing a silicon substrate, the method comprising:
   preparing a parent silicon substrate including a main portion and an edge portion, the main portion having a first flat top surface and the edge portion having a second flat top surface, the second flat top surface being separate from the first flat top surface; and
   forming a crack reducing portion on the second flat top surface of the edge portion of the parent silicon substrate such that directions of crystal faces of the crack reducing portion are different,
   wherein an interface between the silicon edge portion and the crack reducing portion is flat.

14. The method of claim 13, wherein the forming comprises:
   forming a dielectric film on the parent silicon substrate by a patterning process; and
   removing a portion of the dielectric film other than the dielectric film formed on the edge portion by a lift-off process.

15. The method of claim 13, wherein the forming deposits a dielectric film on the edge portion of the parent silicon substrate.

16. The method of claim 15, wherein the forming deposits one of a nitride film and an oxide film on the edge portion.

17. The method of claim 13, wherein the forming implants ions into the second flat top surface of the edge portion of the parent silicon substrate.

18. A method of manufacturing an epitaxial structure, the method comprising:
   forming an edge portion around a main portion of a silicon substrate, the main portion having a first flat top surface and the edge portion having a second flat top surface, the second flat top surface being separate from the first flat top surface;
   forming a crack reducing portion on the second flat top surface of the edge portion of the silicon substrate such that directions of crystal faces of the crack reducing portion are different;
   growing at least one first nitride semiconductor thin film on the main portion of the silicon substrate; and
   forming a second nitride semiconductor thin film on the crack reducing portion of the silicon substrate,
   wherein an interface between the silicon edge portion and the crack reducing portion is flat.

19. The method of claim 18, wherein the forming a crack reducing portion implants ions into the second flat top surface of the edge portion.

20. The method of claim 18, wherein the forming a crack reducing portion deposits a dielectric film on the edge portion of the parent silicon substrate.

21. The method of claim 18, wherein the forming a crack reducing portion deposits one of a nitride film and an oxide film on the edge portion.

* * * * *